United States Patent
Milinichik et al.

(10) Patent No.: US 8,373,441 B1
(45) Date of Patent: Feb. 12, 2013

(54) ORIENTING VOLTAGE TRANSLATORS IN INPUT/OUTPUT BUFFERS

(75) Inventors: John A. Milinichik, Allentown, PA (US); Peter J. Nicholas, Philadelphia, PA (US); Carol A. Huber, Macungie, PA (US); Antonio M. Marques, Newark, NJ (US); Daniel J. Delpero, Allentown, PA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/236,914

(22) Filed: Sep. 20, 2011

(51) Int. Cl.
*H01L 25/00* (2006.01)
*H03K 19/00* (2006.01)
(52) U.S. Cl. .............................. 326/101; 326/41; 326/47
(58) Field of Classification Search .................. 326/41, 326/47, 101; 257/202–203
See application file for complete search history.

(56) References Cited

U.S. PATENT DOCUMENTS

| 7,488,995 | B2 * | 2/2009 | Usami et al. .................. 257/203 |
| 2002/0056857 | A1 * | 5/2002 | Iwasa ............................ 257/203 |
| 2006/0225006 | A1 * | 10/2006 | Chung-Maloney et al. ...... 716/2 |

\* cited by examiner

*Primary Examiner* — Anh Tran

(57) ABSTRACT

Described embodiments provide for a semiconductor device comprising a core and one or more input/output (I/O) buffers surrounding the core. The I/O buffers are adapted to transfer signals associated with core circuitry of the core. The I/O buffers comprise I/O cells having a first orientation and I/O cells having a second orientation. Each I/O cell has a corresponding translator having low voltage transistors in a corresponding footprint. The low voltage transistors in the first orientation I/O cells have the first orientation, and the low voltage transistors in the second orientation I/O cells have the first orientation. The footprints of the first orientation I/O cells and the second orientation I/O cells are compatible with one another.

14 Claims, 3 Drawing Sheets

ORIENTING VOLTAGE TRANSLATORS IN INPUT/OUTPUT BUFFERS

BACKGROUND OF THE INVENTION

1. Field of the Invention

The present invention relates to semiconductor devices, in particular, to input/output (I/O) buffers in semiconductor devices.

2. Description of the Related Art

Semiconductor devices are often manufactured on silicon wafers. As a consequence, a transistor's electrical characteristics vary on the semiconductor according to a variety of factors. Factors affecting the electrical characteristics of a transistor include the direction orientation of its gate and its location relative to other transistors. As semiconductor manufacturing advances using microprocessor technologies, characteristic variations of transistors due to varying orientation of the transistors increasingly affect overall semiconductor performance. For example, many complementary metal oxide semiconductor (CMOS) technologies (e.g., 28 nm technologies) have restrictions on the layout of low voltage transistors.

Semiconductor devices typically include at least one input/output (I/O) circuit in an I/O buffer enabling communication with other devices. The I/O buffers are generally disposed along four sides of an integrated circuit (IC) chip's core area, forming an I/O ring that surrounds the core. The semiconductor's core is where logical computations are made. The I/O buffers on the two sides of the I/O ring typically have a perpendicular orientation to the I/O buffers on the top and bottom of the ring. The orientation of the I/O buffers on the top and bottom might be referred to as a standard orientation, and the orientation of the I/O buffers on the sides might be referred to as a rotated orientation. The I/O buffers on the sides of the I/O ring might be laid out the same as the top and bottom I/O buffers, but then they are rotated 90 degrees.

I/O buffers employ voltage translators to interface between off-chip supply voltages and lower core-logic voltages. The voltage translators often employ low voltage transistors with narrow gates, and the transistors' performance characteristics, such as timing, are highly dependent upon their orientation. For example, some CMOS technologies require all narrow length, low voltage transistor gates to be oriented in the same direction in a chip and a wafer. Rotating a low voltage gate 90 degrees in an I/O buffer, as is common practice, alters device performance and timing in CMOS technologies that are highly dependent on layout topological design. A separate, rotated layout for the I/O buffers that occupy the sides of the ring might ensure all translator circuits with low voltage devices are oriented in the same direction. However, this practice is inefficient and the different features of the two layouts affect performance of the translator and the I/O buffers. Other approaches, as described in United States Patent Publication No. 2010/0096670 filed on Dec. 18, 2009, do not rotate the I/O buffers, and thus all I/O buffers have the same orientation.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide for Input/Output (I/O) buffers implemented in, for example, semiconductor devices having a core comprising core circuitry. The one or more I/O buffers surround the core and transfer signals associated with the core circuitry of the semiconductor device. The one or more I/O buffers comprise first orientation I/O cells and second orientation I/O cells, each I/O cell having a corresponding translator having low voltage transistors in a corresponding footprint, wherein the low voltage transistors of the translator in a first orientation I/O cell have the first orientation, and the low voltage transistors of the translator in a second orientation I/O cell have the first orientation. The footprints of the first orientation I/O cells and second orientation I/O cells are compatible with one another.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with embodiments of the present invention, Input/Output (I/O) buffers are implemented in, for example, semiconductor devices with sets of translators compatible with both standard orientation and rotated orientation I/O buffer configurations. Each set of translators comprises a pair of translators having a predefined (e.g., consistent) footprint in a given integrated circuit (IC) design for the semiconductor device. The consistent footprint is defined as both translators having the same attributes such as shape, size, and pin/bus locations. Additionally, a set of translators having similar topological design features surround low voltage devices of the IC, resulting in equivalent parametric timing characteristics. Each set of translators comprises a translator for a standard orientation I/O buffer (e.g., a "vertical" orientation in x-y coordinates), and a translator for a rotated orientation I/O buffer (e.g., a "horizontal" orientation in x-y coordinates).

Figure 1:
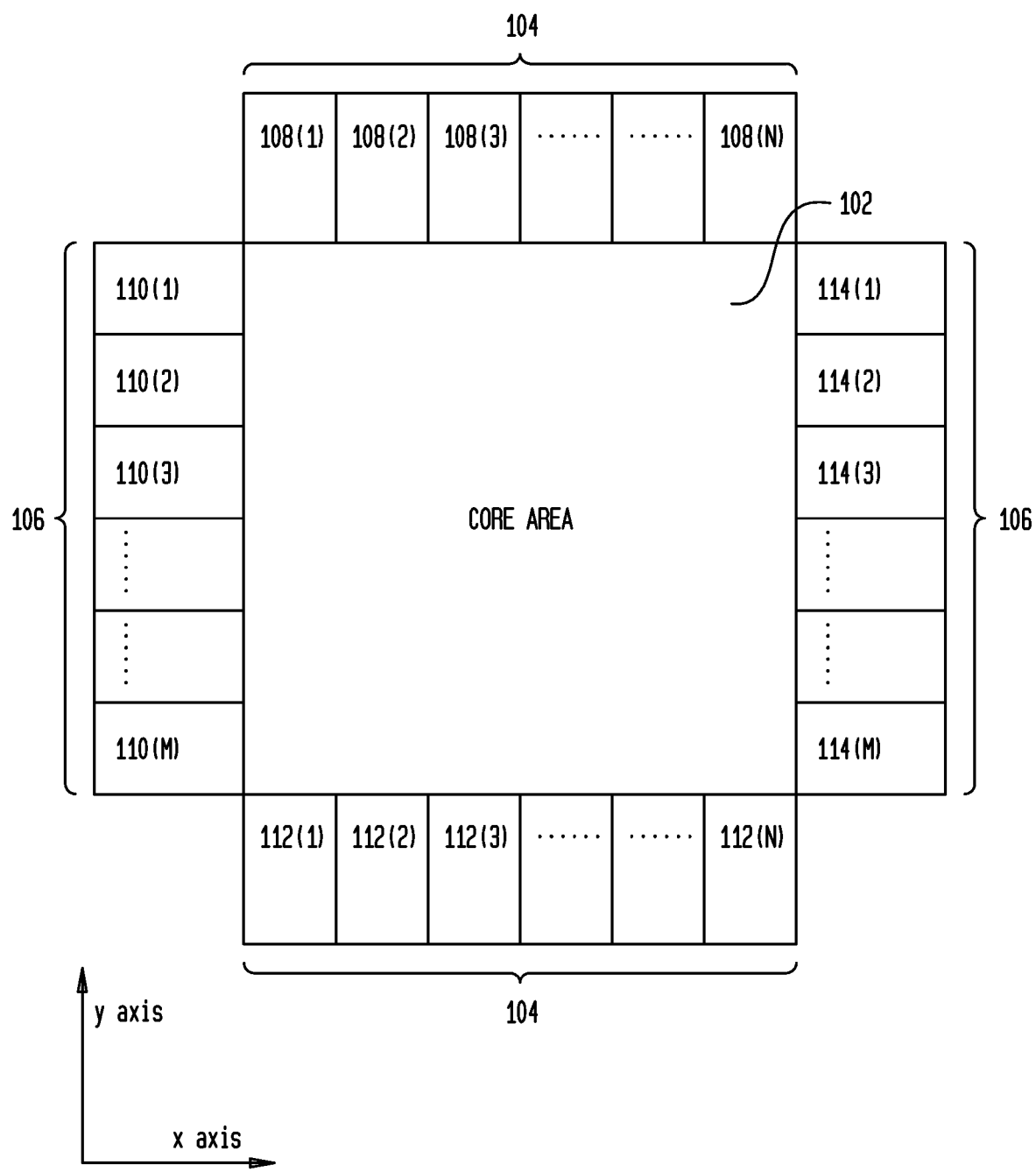
FIG. 1 shows a layout of I/O buffer cells in a semiconductor device operating in accordance with exemplary embodiments of the present invention.

FIG. 1 shows semiconductor device 100 comprising core area 102, vertical I/O buffers 104, and horizontal I/O buffers 106. Semiconductor device 100 might be an IC implemented with, for example, CMOS technology. I/O buffers 104 and 106 are arranged on the four sides of core area 102, forming a ring around core area 102. Vertical I/O buffers 104 are comprised of vertical I/O cells 108(1)-108(N) and 112(1)-112(N), and horizontal I/O buffers 106 are comprised of horizontal I/O cells 110(1)-110(M) and 114(1)-114(M), where N and M are integers greater than or equal to one. Each of vertical I/O cells 108(1)-108(N) and 112(1)-112(N) are arranged such that their longer, rectangular edges are substantially parallel with a y-axis. Each of horizontal I/O cells 110(1)-110(M) and 114(1)-114(M) are arranged such that their longer rectangular edges are substantially parallel with an x-axis. Consequently, the I/O cells are arranged such that their shorter rectangular edges are substantially parallel to an edge of core area 102.

I/O cells 108, 110, 112, and 114 might transfer signals from an external device to core area 102. I/O cells 108, 110, 112, and 114 are also adapted to transfer signals from core area 102 to an external device. I/O cells 108, 110, 112, and 114 might also transfer signals between I/O cells 108, 110, 112, and 114, and they might convert voltage between a core voltage and an external voltage. Core area 102 performs the logical computations for semiconductor device 100. For example, core area 102 might contain multiplexers, logic gates, and operational amplifiers. Semiconductor 100 using core area 102 might have a variety of functions, including functioning as a random access memory (RAM), core processor (such as for a mobile phone or computer), or an application specific integrated circuit (ASIC).

Figure 2:
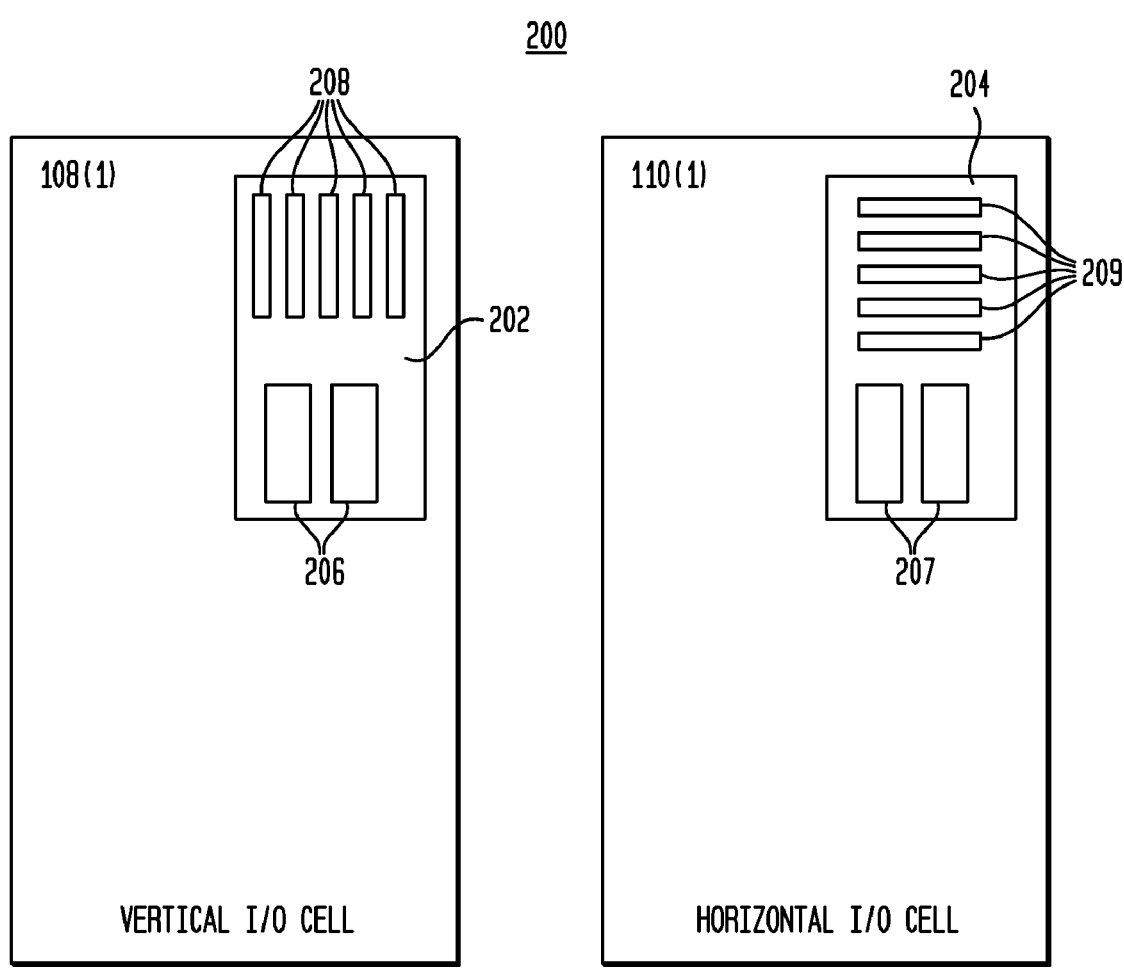
FIG. 2 shows a block diagram of an exemplary translator pair set employed by the I/O buffer cells of FIG. 1.

FIG. 2 shows an exemplary translator pair set 200 formed from I/O cells 108(1) and 110(1) as might be employed by semiconductor device 100 of FIG. 1. I/O cells 108(1) and 110(1) employ translators 202 and 204, respectively, in accordance with embodiments of the present invention. As shown in FIG. 2, both vertical I/O cell 108(1) and horizontal I/O cell 110(1) might be designed and built in the same buffer orientation (shown as vertical in FIG. 2). Vertical I/O cell 108(1) employs translator 202, and horizontal I/O cell 110(1) employs translator 204. Translator 202 employs high voltage devices 206 and translator 204 employs high voltage devices 207. Translator 202 employs low voltage devices with low voltage gates 208 and translator 204 employs low voltage devices with low voltage gates 209. Translators 202 and 204 might be footprint compatible. Footprint compatibility means that the top level attributes of translator 202 might be substantially equivalent to the top level attributes of translator 204. Exemplary top level attributes include shape, size, metal levels, timing characteristics, pin locations, and bus locations. By building paired sets of footprint compatible translators such as translator pair set 200, horizontal I/O cell 110(1) might be built from vertical I/O cell 108(1) by replacing translator 202 with translator 204. In the same manner, vertical I/O cell 108(1) might be built from horizontal I/O cell 110(1) by replacing translator 304 with translator 302. For example, translator swaps enable horizontal I/O buffer 106 to be built from vertical I/O buffer 104 without any rewire or other changes to vertical I/O buffer 104. Translators 202 and 204 might translate voltage up (e.g., 0.85V to 1.8V) or might translate voltage down (e.g., 1.8V to 0.85V).

Low voltage gates 208 and 209 might be parts of corresponding positive-type (p-type) MOS transistors and negative type (n-type) MOS transistors. Semiconductor device 100 might be comprised of many overlapping layers, each layer defined by lithography. Some layers might mark where various dopants are diffused into the substrate (diffusion layers), some layers define where additional ions are implanted (implant layers), some layers define the conductors (e.g., polysilicon or metal layers), and some layers define the connections between conducting layers (contact layers). A transistor with low voltage gates 208 and 209 might be formed whenever a gate layer crosses a diffusion layer. For example, a p-type transistor might have low voltage gates 208 and 209 which have a length, its length crossing two diffusion layers. The direction of the length of low voltage gates 208 and 209 defines the orientation of the transistor. The orientation of low voltage gates 208 and 209 is represented in FIG. 2 as the longer edges of a rectangle. For example, low voltage gates 208 in FIG. 2 have a perpendicular orientation to that of low voltage gates 209. High voltage devices 206 are parallel with high voltage devices 207 in FIG. 2. Horizontal I/O cell 110(1) might be rotated so that low voltage gates 209 have an orientation that is substantially parallel with the orientation of low voltage gates 208. In this case, high voltage devices 207 have an orientation that that is parallel with the orientation of high voltage devices 206.

Figure 3:
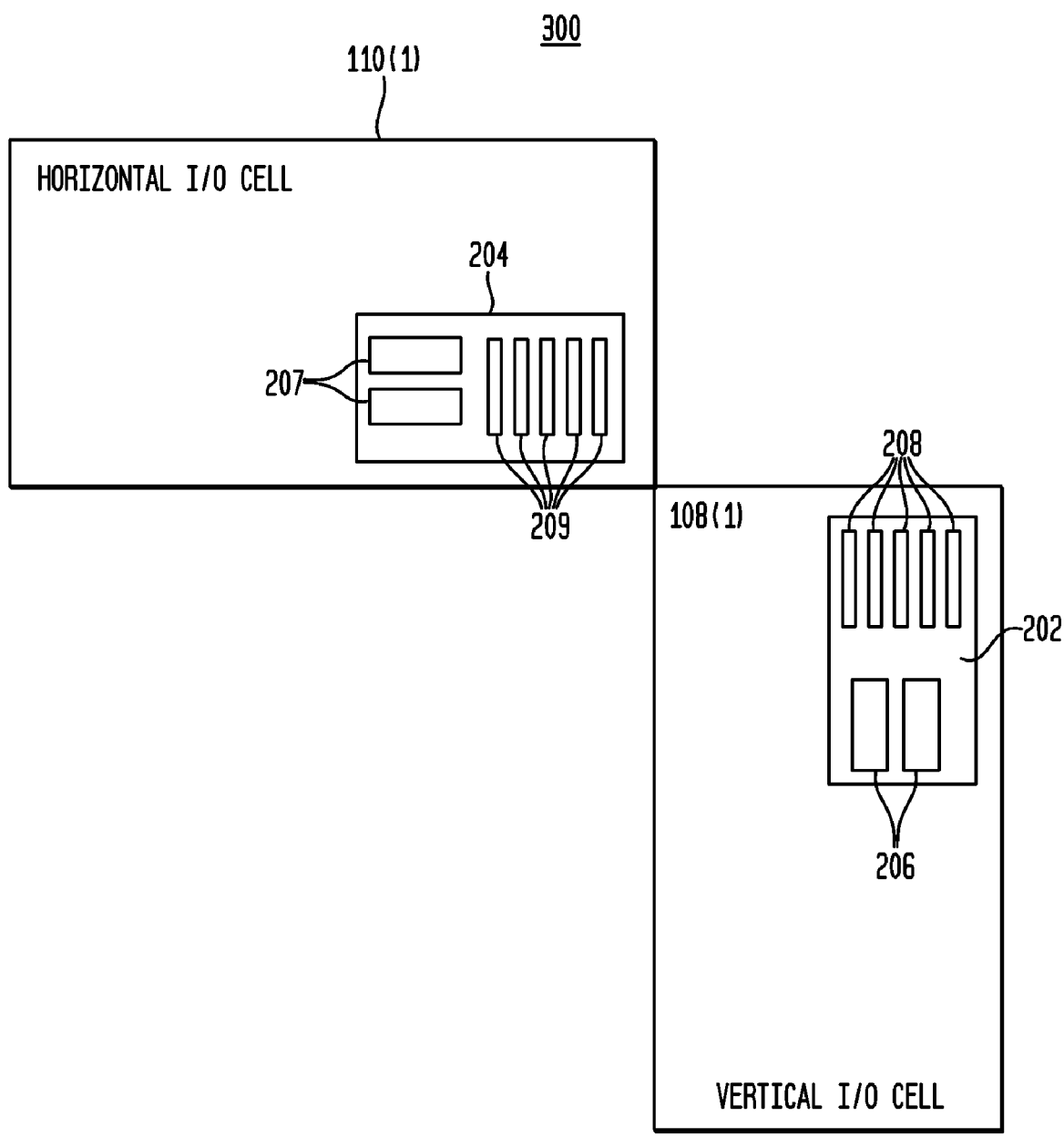
FIG. 3 shows a layout of translators in a semiconductor device in accordance with embodiments of the present invention.

FIG. 3 shows partial semiconductor device 300 employing a rotated embodiment of translator pair set 200. Translator 204 and horizontal I/O cell 110(1) are rotated 90 degrees from vertical I/O cell 108(1). The rotation permits all low voltage gates 208 and 209 to be parallel with one another. For example, low voltage transistor gates 208 and 209 have a vertical orientation in FIG. 3. High voltage devices 206 have a perpendicular orientation to that of high voltage devices 207 in partial semiconductor device 300. The transistor layout of translators 202 and 204 might consist of the high voltage devices in their own "blocks", and a set of squared off blocks of low voltage transistors, such as low voltage transistor gates 208 and 209 shown in FIG. 3. The low voltage transistors might have dummy features including shadow gates and a frame of dummy transistors surrounding the active transistors to maintain stress parameters relatively close in value between the two differently oriented translators. Dummy features might also be employed to improve efficiency when rotating the blocks. For example, dummy features might be the same distance from active devices in both orientations while gate spacing might also be identical in both orientations. Additionally, active areas might be the same distance from other active areas in both orientations.

The present invention might allow for the following advantages over previously known designs in which building a second layout (e.g., rotated layout) might involve a manual redesign of the low voltage sections of the I/O buffer by rotating and repacking the voltage gates as space allowed. With these previously known designs, the overall rotated I/O buffer might be a different size than the standard buffer, and its core ports might be in different locations than the standard buffer. The present invention instead builds a layout for the standard I/O buffer, then swaps the translators to build the layout of the rotated I/O buffer without rewiring or significant changes to the overall buffer design. Both the rotated and standard translators have pins and rail power connections in approximately the same locations within the corresponding translator, and both translators are the same size and shape, allowing for swapping of the translators to build a rotated orientation I/O buffer. Consequently, IC designs incorporating embodiments of the present invention might allow for more efficient design with increased device performance and timing in, for example, complementary metal oxide semiconductor (CMOS) technologies that are highly dependent on layout topological design.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While the exemplary embodiments of the present invention have been described with respect to processing in hardware, including possible implementation as a single integrated circuit, a multi-chip module, a single card, or a multi-card circuit pack, the present invention is not so limited. As would be apparent to one skilled in the art, various functions of hardware may also be implemented in a software program. Such software may be implemented as steps performed by, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

It will be further understood that various changes in the details, materials, and arrangements of the parts which have been described and illustrated in order to explain the nature of this invention may be made by those skilled in the art without departing from the scope of the invention as expressed in the following claims.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A semiconductor device comprising:
    a core comprising core circuitry of the semiconductor device; and
    one or more input/output (I/O) buffers surrounding the core and adapted to transfer signals associated with the core circuitry of the semiconductor device, wherein the one or more I/O buffers comprise first orientation I/O cells and second orientation I/O cells, each I/O cell having a corresponding translator having low voltage transistors in a corresponding footprint,
    wherein the low voltage transistors of the translator in a first orientation I/O cell have the first orientation, and the low voltage transistors of the translator in a second orientation I/O cell have the first orientation, the footprints of the first orientation I/O cells and second orientation I/O cells compatible with one another.

2. The device of claim 1, wherein the first orientation I/O cells have the first orientation and the second orientation I/O cells have the second orientation, the second orientation perpendicular to the first orientation.

3. The device of claim 2, wherein the translator in each first orientation I/O cell is adapted to replace an associated translator in each second orientation I/O cell, thereby forming one of the first orientation I/O cells.

4. The device of claim 2, wherein the translator in each second orientation I/O cell is adapted to replace an associated translator in each first orientation I/O cell, thereby forming one of the second orientation I/O cells.

5. The device of claim 1, wherein the footprint of the first orientation I/O cells and the second orientation I/O cells comprise a size, shape, and one or more pin locations.

6. The device of claim 1, wherein each translator further comprises high voltage transistors,
    wherein the high voltage transistors of the translator in the first orientation I/O cell have the first orientation, and the high voltage transistors of the translator in the second orientation I/O cell have the second orientation.

7. The device of claim 6, wherein the first orientation I/O cells have the first orientation and the second orientation I/O cells have the second orientation, the second orientation perpendicular to the first orientation.

8. A method of forming a semiconductor device having core circuitry, the method comprising:
    placing one or more input/output (I/O) buffers about the core, the I/O buffers corresponding to signals associated with the core circuitry of the semiconductor device;
    forming one or more first I/O cells in a first orientation in selected ones of the one or more I/O buffers, each first I/O cell having a corresponding translator having low voltage transistors in a corresponding footprint;
    forming one or more second I/O cells in a second orientation in selected ones of the one or more I/O buffers, each second I/O cell having a corresponding translator having low voltage transistors in a corresponding footprint, wherein the footprints of the second I/O cells and the first I/O cells are compatible with one another;
    aligning the low voltage transistors of the translators in the first I/O cells in the first orientation; and
    aligning the low voltage transistors of the translators in the second I/O cells in the first orientation.

9. The method of claim 8, wherein the first orientation is perpendicular to the second orientation.

10. The method of claim 9, the method further comprising:
    forming the first I/O cells, the forming comprising replacing the translator in each second I/O cell with an associated translator from each first I/O cell.

11. The method of claim 9, the method further comprising:
forming the second I/O cells, the forming comprising replacing the translator in each first I/O cell with an associated translator from each second I/O cell.

12. The method of claim 8, wherein the footprint of the first I/O cells and the second orientation I/O cells comprise a size, shape, and one or more pin locations.

13. The method of claim 8, the method further comprising:
aligning one or more high voltage transistors in the translators in the first I/O cells in the first orientation; and
aligning one or more high voltage transistors in the translators in the second I/O cells in the second orientation.

14. The method of claim 13, wherein the first orientation is perpendicular to the second orientation.

* * * * *